United States Patent [19]

Compton et al.

[11] 4,042,836
[45] Aug. 16, 1977

[54] FIELD EFFECT TRANSISTOR SWITCH

[75] Inventors: James B. Compton, Los Gatos; Sam S. Ochi, San Jose, both of Calif.

[73] Assignee: National Semiconductor Corporation, Santa Clara, Calif.

[21] Appl. No.: 676,096

[22] Filed: Apr. 12, 1976

[51] Int. Cl.$^2$ ............... H03K 17/16; H03K 17/60; H03K 17/72

[52] U.S. Cl. .................. 307/251; 307/255; 307/304

[58] Field of Search ............... 307/239, 240, 249, 251, 307/255, 304, 235 B, 235 C, 246; 328/150–151

[56] References Cited
U.S. PATENT DOCUMENTS

| | | | |
|---|---|---|---|
| 3,911,294 | 10/1975 | Davis et al. | 307/251 |
| 3,916,222 | 10/1975 | Compton | 307/251 |
| 3,955,103 | 5/1976 | Russell et al. | 307/251 |

*Primary Examiner*—John S. Heyman
*Assistant Examiner*—Larry N. Anagnos
*Attorney, Agent, or Firm*—Gail W. Woodward; Willis E. Higgins

[57] ABSTRACT

A field effect transistor (FET) is designed to act as an off-on type switch by the control of a driver voltage applied to its gate electrode. A driver circuit, responsive to a toggling current, provides a control of gate electrode voltage. The circuit includes means for rapidly switching the FET on and off while drawing relatively low current in the off and on states. Improvements relate to means for speeding up turn on time and reducing charge transferred to the circuit being switched by the FET.

9 Claims, 2 Drawing Figures

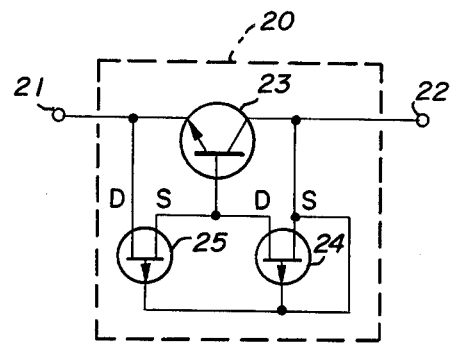
Fig_1
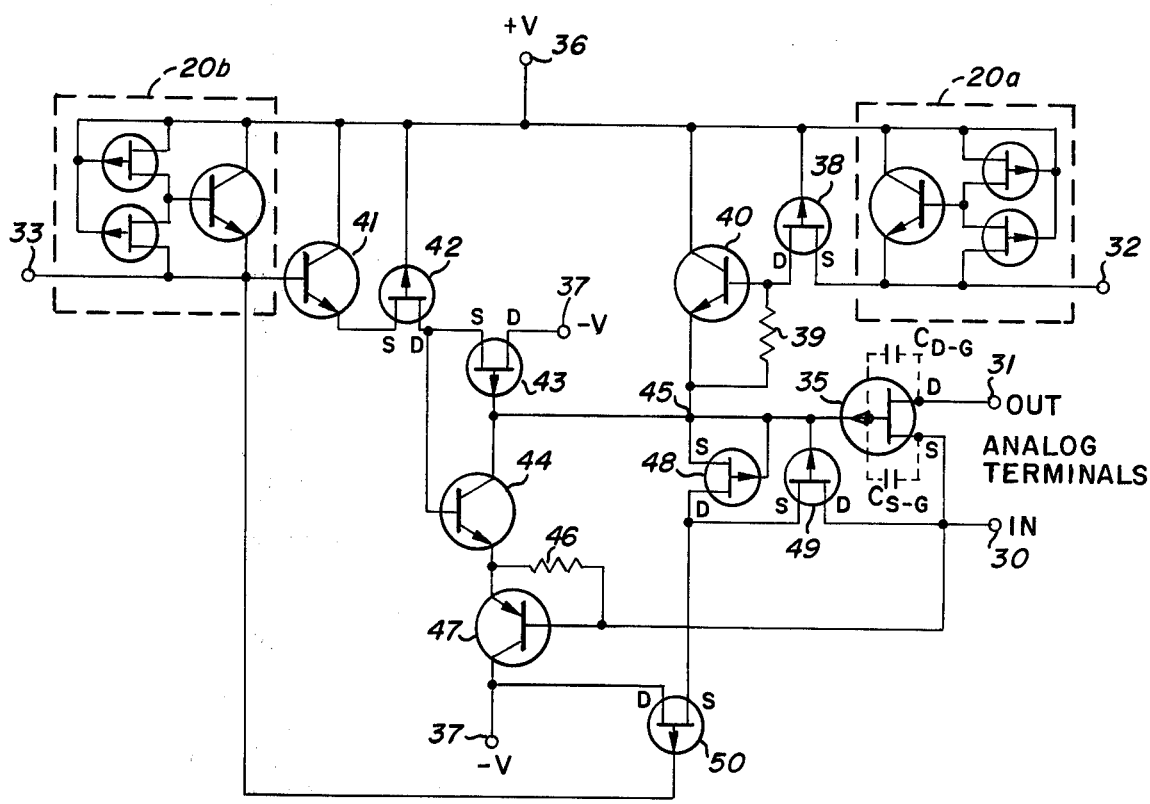
Fig_2

FIELD EFFECT TRANSISTOR SWITCH

BACKGROUND OF THE INVENTION

The circuit of the present invention is an improvement on the circuit shown in U.S. Pat. No. 3,916,222 which issued to James B. Compton on Oct. 28, 1975. The basic element is a field effect transistor (FET) that is switched by means of its gate potential so that it will be either in a high resistance off state or a low resistance on state. In effect the FET is a SPST switch that is toggled by means of a control current. Such devices are very useful in switching analog signals because the circuits can be arranged so that the FET gate voltage or control can be made to track the source voltage, thus ensuring positive control over an analog voltage that can have a component of varying magnitude. The control circuits can be designed to switch the FET very rapidly and to dissipate relatively little steady state power. Finally the entire switch including control circuits can be fabricated into a common semiconductor substrate using conventional I.C. techniques. In fact it is common to fabricate a plurality of switch circuits, for example six, in a single I.C. chip thus making a very compact device useful in multiplex applications.

In practice a low on resistance switch FET is used in order to achieve low voltage offset errors. This means that the gate to substrate capacitance is correspondingly large. When switching, this capacitance must be charged to turn the switch off and discharged to turn the switch on. The driver circuitry therefore must be capable of handling large current transients while dissipating minimum power in the steady state conditions. The subject of U.S. Pat. No. 3,916,222 is in part a showing of how to discharge gate capacitance so as rapidly to turn the FET on using a low steady state power dissipation, particularly in the off switch state.

Another aspect of the prior art is the capability of integrating transistors and FETs in a common substrate. While all of the FETs fabricated simultaneously will tend to track each other in that they will all have similar pinch off voltage (Vp), the absolute value of this voltage can vary substantially in a mass production process. This makes matching FETs and transistors a difficult control process.

As pointed out above the actuation of a FET switch involves the charging and discharging of the gate capacitance and this can involve the transfer of substantial transient currents. This has the unfortunate effect of superimposing transients on the analog output line. As the circuit switching speeds are increased, these transients can become a real problem in the analog circuits.

SUMMARY OF THE INVENTION

It is an object of the invention to provide a circuit in which an analog switching FET is driven by a circuit that combines transistors and FETS that produce rapid, transient-free analog switching.

It is a further object of the invention to provide a circuit for analog switching in which FETs and transistors are combined in a transient-free switching arrangement that is accomplished using combinations that accomodate a substantial range of FET parameters in a self compensating configuration.

It is a still further object of the invention to switch a FET to control an analog circuit so as to induce minimum disturbance thereof while switching at high speed using a driver that tracks the analog voltage over a substantial range of voltage.

These and other objects are achieved in a circuit wherein a combination of transistors and FETs are used to switch a low resistance FET. The analog circuit voltage is sampled and used to track the drive voltage for level compensation. The tracking sample is made small so as to produce minimum disturbance of the analog circuit during switching. High speed switching is achieved by using amplified charge and discharge circuits that function as amplifiers only during the transient interval and are inactive in the steady state. Since the circuit employs FETs in combination with transistors and FET pinch off voltage is difficult to maintain at an absolute value, the circuit provides means for accomodating a large variation in pinch off voltage from one circuit to another.

BRIEF DESCRIPTION OF THE DRAWING

FIG. 1 is a schematic diagram of a constant voltage circuit in which the voltage developed is related to the pinch off voltage of a FET; and FIG. 2 is a schematic diagram of an analog FET switch in which the driver circuit uses FETs and transistors in a self compensating arrangement.

DESCRIPTION OF THE INVENTION

FIG. 1 shows a circuit in which transistor and FET elements are combined to produce a constant voltage that is a function of the Vp of a FET. The circuit 20 develops a current responsive voltage that is constant above a threshold current value. The performance of voltage source 20 shown inside dashed outline is as follows.

When terminal 21 is connected to a negative source of potential, current will flow depending upon how negative source terminal 21 is driven. The same current flows at terminal 22 which ultimately returns to the positive end of the potential source.

At very low current values transistor 23 will be essentially non conductive and the small current will flow through FETs 24 and 25. At the very low current values both FETs will act as resistors of constant value. Since the gate of FET 24 is returned to its source, it will act like a resistor at all current values. However, since the gate of FET 25 is returned to the source of FET 24, any potential developed across the source-drain terminals of FET 24 will bias the gate of FET 25 positive with respect to its source. When the potential drop across FET 25 exceeds about 0.6 volt, transistor 23 will begin to conduct and pass a portion of the terminal 21 current. As the total current continues to increase, at some point the potential between source and gate of FET 25 will arrive at pinch off (Vp) and any further increase in total current will result in a rapid rise in potential across FET 25 and this will in turn greatly increase conduction in transistor 23. At currents well in excess of the current that develops Vp across FET 24 practically all of the current is drawn through transistor 23. Thus the action of voltage source 20 is to develop a constant voltage between terminals 21 and 22 above a particular or threshold current. When the circuit is operated with a current in excess of this threshold value the voltage between terminals will be constant up to a maximum of Vp + 0.6 volts (for silicon devices) dependent on the ratio of $I_{DSS}$ of FET 25 to FET 24. In essence then a constant-voltage two-terminal device is available that is related to the pinch off voltage of the FET devices manufactured on a particular semiconductor substrate. This means that when all FETs and transistors in a given I.C. are manufactured on a common substrate, a Vp related constant voltage device is available to be used to compensate all of the associated FETs. Thus even though there should be substantial variation in Vp in a production process, all of the devices on a particular substrate or circuit chip track and will be compensated from one process wafer to another. Without this compensation the FETs would have to be manufactured to a precision specification that would be extremely difficult to meet.

FIG. 2 is a complete switch schematic diagram using two circuits 20a and 20b of the kind shown in FIG. 1. Switch operation is by way of terminals 30 and 31. Analog signals applied to terminal 30 will appear at terminal 31, or not, depending upon the switch state. The switch state will be controlled by terminals 32 and 33 at which complementary control currents are applied. When control current is pulled out of terminal 33 the switch will be open, or off. The control current drive is conventional and is typically obtained from a differential amplifier (not shown) connected to a negative voltage terminal or current sink by way of a constant current device (also not shown). The switching or toggle signals are not critical. The current value only has to exceed the threshold current value mentioned in connection with circuit 20.

For the following circuit description a FET Vp of about 5 volts will be assumed. It is to be understood that while the Vp value will be constant among devices on a particular chip the value can vary substantially from chips on different wafers and even on chips from different areas on a particular wafer.

The heart of the circuit is FET 35 which controls the transfer of analog signals between terminals 30 and 31. This is a low resistance device and therefore has substantial gate capacitance as shown in dashed outline as $C_{D-G}$ and $C_{S-G}$. In order to turn FET 35 on and off the stray capacitances must be discharged and charged. To do this rapidly, low impedance transient drive circuitry must be employed.

For the following discussion $+V$ and $-V$ on terminals 36 and 37 respectively will be assumed to be about 15 volts each or a total potential of about 30 volts. The analog tracking capability of the circuit is at least $\pm 5$ volts.

The switch on state will be descirbed first. For this condition current is pulled out of terminal 32 as a control. The associated circuit 20a will develop approximately 5.6 volts thereby placing terminal 32 at about 9.4 volts. This set of conditions will pinch off FET 38. Since there is no current flowing in resistor 39, transistor 40 will be off thereby disconnecting the gate of FET 35 from $+V$ terminal 36.

At terminal 33 the complementary current will be low or zero. The current through associated circuit 20b will be due only to base current in transistor 41 which will be below the constant voltage threshold of circuit 20b. This pulls the base of transistor 41 toward $+15$ volts and the emitter will follow to a level of about 14.4 volts, the difference being due to the emitter base drop of about 0.6 volt. This will turn FET 42 on which will in turn pull the base of transistor 44 toward a positive potential. The conduction of FET 42 will depend upon the conduction of series FET 43 and the juncture of these two FETs will therefore be at some potential that could vary over a substantial range. This voltage, which sets the base voltage of transistor 44, will be modulated by transient reactions of the switch circuit to the analog voltage level that will be discussed hereinafter.

In the steady state condition, the potential difference between terminal 30 and node 45 will be small and transistor 44 will be non conductive. Since no current flows in resistor 46, transistor 47 will also be non conductive. It can be seen that for the steady state the only power supply current flowing is through transistor 41 and FETs 42 and 43. These FETs can be made small so that this current is very low. In this steady state on condition, FET 48 will be conductive because its gate is returned to its source. FET 49 will be conductive because FET 48 will pull its source to about gate potential. Thus FETs 48 and 49 will both conduct and will keep the gate of FET 35 at about its source potential so the switch will remain on. These conditions will prevail for small analog signal variations at terminal 30.

In the switch off state the current pulled out of terminal 32 goes low or essentially to zero and terminal 32 voltage will be pulled to close to $+15$ volts via circuit 20a. This turns FET 38 on and this pulls the base of transistor 40 toward $+15$ volts. The emitter of transistor 40 will follow thereby pulling node 45 to about 14.4 volts. The emitter follower action of transistor 40 will quickly charge the gate capacitance of FET 35 and turn it off. This action will also turn off FET 49 by way of FET 48.

Simultaneously in the off state complementary current is pulled out of terminal 33. The constant voltage action of circuit 20b will place terminal 33 at about $+9.4$ volts. This will drive the emitter of transistor 41 to somewhat under a potential that will turn transistor 41 off and this will pinch off FET 42. This in turn turns transistor 44 off. This prevents current from flowing in resistor 46 and thereby holds transistor 47 off.

Node 45 is at about $+14.4$ volts and terminal 33 is at about $+9.4$ volts. FET 48 will act as a resistor and FET 50 will conduct to place its source at about 9.4 volts. Thus current will flow in the series circuit comprising FETs 48 and 50 and transistor 40. This steady state current too can be kept small. The voltage drop of about 5.3 volts across FET 48 will pinch off FET 49 and it can be seen that terminal 30 is fully isolated from the remainder of the circuit except for minor leakage paths and stray capacitance. Also since transistor 40 clamps node 45 as a low impedance element, stray capacitance feed through around FET 35 between terminals 30 and 31 is well attenuated and the switch is truly off.

The steady state on and off states have been described and now the off-to-on transient will be described. In the off state node 45 is at about 14.4 volts and the gate capacitance of FET 35 charged. When the switch is rapidly switched on, node 45 must be rapidly forced to the potential at terminal 30. Under the prior art conditions this, if done quickly, would force a large transient onto terminals 30 and 31. This disturbance could seriously interfere with the operation of the analog circuit being switched.

When the on state is invoked by pulling current out of terminal 32 and simultaneously reducing the current out of terminal 33 to near zero, transistor 40 will be quickly turned off thus disconnecting it from node 45. At the same time terminal 33 will be driven toward $+15$ volts therby truning FET 50 off and FET 42 on. At this instant node 45 is charged to about 14.4 volts so that FET 43 is turned off and the base of transistor 44 pulled toward 14.4 volts. Transistor 44 will turn on hard in an attempt to rapidly discharge node 45 to the potential at terminal 30. The resultant current through resistor 46 will turn transistor 47 on thus connecting a current sink, the negative power supply terminal 37, to node 45. This means that node 45 will rapidly discharge toward −15 volts through transistors 44 and 47 which are hard on. It is to be noted here that the discharge is to a sink, not to terminal 30 and transients are thus avoided. In fact the reduction in transient at terminal 30 will be by a factor equal to the amplification factor or beta of transistor 47 and this can be made very large. The transient reduction is great enough to permit very rapid switch turn off while retaining sufficient transient avoidance to render acceptable analog circuit performance.

As the node 45 potential approaches the terminal 30 potential, transistor 44 will stop conducting and thus turn transistor 47 off. This permits FETs 48 and 49 to track node 45 with terminal 30 as described above. Since FETs 48 and 49 are not required to carry the large transient current, they can be very small. Transistors 44 and 47 which can conduct heavily are only operative during the transient and can switch FET 35 rapidly while directing the transient current away from the analog circuit.

It will be noted that the above-described circuit employs complementary bipolar transistors with the only PNP device being used having −V connected collector. All other transistors are of the NPN variety and are conventional. Such devices are easily achieved in conventional I.C. processing. All FETs are of the same polarity and would be fabricated simultaneously with the bipolar transistors. Thus the circuit in its entirety is amenable to conventional I.C. processing. The circuit is sensitive to the FET pinch off voltage. While this value is difficult to hold to a precise value in the I.C. processing, for a given circuit chip all of the FETs will tend to have the same pinch off voltage. Since the circuit includes a pair of constant voltage sources, with their voltage being slightly greater by a fixed increment than FET pinch off voltage, the variation in pinch off is self compensating. That is, if pinch off increases, the switching voltages are correspondingly increased. Thus the circuit operating conditions actually track the FET requirements.

For the conditions specified in the circuit description, the analog voltage at terminal 30 can accomodate signals in the range of about ±5 volts. This can include d-c components and signal components together. If the FETs being used have some other pinch off voltage the analog range will be different but, in practice, this value can be kept sufficiently high to meet very reasonable specifications.

The switching circuit has been described in a particular embodiment and its operation has been described. It is clear that there are alternatives and equivalents that will occur to a person skilled in the art. For example, while a particular kind of FET has been shown, its complement could be used. In this case the polarity of the bipolar transistors would be complementary and the power supply voltage would be reversed. Also while junction FETs are shown, some or all could be of the MOS FET or IG FET variety. Furthermore the resistors shown could be made in the form of a biased-on FET. Accordingly we intend that our invention be limited only by the claims that follow.

We claim:

1. A FET switch circuit having a switching cycle including an off state, an on state, and a transient state which exists between said off and on state, said circuit having a switching FET including a gate and a source to drain circuit, said source to drain circuit being coupled to an input terminal and an output terminal, said input and output terminals to be interconnected by said switching FET in said on state and disconnected by said FET in said off state; first and second control terminals whereby current flowing in said first terminal turns said switching FET off and current flowing in said second terminal turns said switching FET on; and a driver circuit coupled between said switching FET and said control terminals to control the off and on states of said switching FET in response to said currents in said terminals; said driver circuit comprising:

first transistor means responsive to said current in said first terminal and coupled to said gate of said switching FET to switch to said off state; and second transistor means responsive to said current in said second terminal and coupled to said gate of said switching FET to switch to said on state, said second transistor means including means for coupling said gate of said switching FET to a current sink during said transient when said switching FET is being switched from the off state to the on state and means for holding said switching FET in said on state under steady state conditions.

2. The circuit of claim 1 wherein said means for coupling comprise:

transient transistor means coupled between said gate of said switching FET and a current sink whereby gate capacitance can be rapidly discharged into said sink, and means for rendering said transient transistor means non conductive under steady state conditions.

3. The circuit of claim 2 wherein said transient transistor means comprise:

complementary transistors coupled together in emitter to emitter configuration and coupled in conductive configuration between said gate of said switching FET and said current sink and circuit means for rendering said complementary transistors conductive when the potential of said switching FET gate is raised toward pinch off with respect to said source.

4. In a FET switch circuit for on and off control of an analog signal current in response to complementary on and off control currents, said circuit including a switching FET having a gate and a source to drain analog current control coupled to an input terminal and an output terminal, said input and output terminals being connected by said switching FET when biased by said gate to an on state and disconnected when biased by said gate to an off state, first and second control terminals whereby said complementary control currents operate to establish the state of bias on said gate of said switching FET, and driver circuit means coupled between said gate of said switching FET and said control terminals whereby current flowing in said first control terminal acts through said driver to bias said switching FET gate off and current flowing in said second terminal acts through said driver to bias said switching FET gate on, the improvement comprising:

means responsive to said control current flowing in said first control terminal for coupling said gate of said switching FET to a current source to charge said gate positively to greater than pinch off potential, means responsive to said control current flowing in said second control terminal to couple said gate of said switching FET to said input terminal and to hold said switching FET in said on state, and means responsive to said control current flowing in said second control terminal, and a charge on said switching FET gate, to couple said gate to a current sink whereby said last named means discharges said switching FET gate and reduces the effect of such discharge on said analog signal.

5. The improvement of claim 4 wherein said last named means comprise:

transistor means coupled between said gate of said switching FET and said current sink, and means for biasing said transistor conductive in response to the combination of control current flowing in said first control terminal and a charge on said switching FET gate.

6. The improvement of claim 5 wherein said transistor means further comprise complementary transistors coupled together in emitter to emitter configuration and coupled between said gate of said switching FET and said current sink.

7. In a FET switch for on and off control of an analog signal current in response to complementary on and off control currents, said circuit including a switching FET having a gate and a source to drain analog current control coupled to an input terminal and an output terminal, said input and output terminals being connected by said switching FET when biased by said gate to an on state and disconnected when biased by said gate to an off state, first and second control terminals whereby said complementary control currents operate to establish the state of bias on said gate of said switching FET, and driver circuit means coupled between said gate of said switching FET and said control terminals whereby current flowing in said first control terminal acts through said driver to bias said switching FET gate off and current flowing in said second terminal acts through said driver to bias said switching FET gate on, the improvement comprising:

means responsive to said control current flowing in said first control terminal for coupling said gate of said switching FET to a current sink to charge said gate negatively to greater than pinch off potential, means responsive to said control current flowing in said second terminal to couple said gate of said switching FET to said input terminal and to hold said said switching FET in said on state, and means responsive to said control current flowing in said second control terminal and a charge on said switching FET gate to couple said gate to a current source whereby said last named means discharges said switching FET gate and reduces the effect of such discharge on said analog signal.

8. The improvement of claim 7 wherein said last named means comprise:

transistor means coupled between said gate of said switching FET and said current source, and means for biasing said transistor conductive in response to the combination of current flowing in said first control terminal and a charge on said switching FET gate.

9. The improvement of claim 8 wherein said transistor means further comprise complementary transistors coupled together in emitter to emitter configuration and coupled between said gate of said switching FET and said current source.

* * * * *